(12) United States Patent
Tatemichi et al.

(10) Patent No.: US 9,728,390 B2
(45) Date of Patent: Aug. 8, 2017

(54) MASS ANALYZING ELECTROMAGNET AND ION BEAM IRRADIATION APPARATUS

(71) Applicant: NISSIN ION EQUIPMENT CO., LTD., Kyoto-shi, Kyoto (JP)

(72) Inventors: Junichi Tatemichi, Kyoto (JP); Shojiro Dohi, Kyoto (JP); Ippei Nishimura, Kyoto (JP)

(73) Assignee: Nissin Ion Equipment Co., Ltd., Kyoto-shi (JP)

( * ) Notice: Subject to any disclaimer, the term of this patent is extended or adjusted under 35 U.S.C. 154(b) by 0 days.

(21) Appl. No.: 14/876,263

(22) Filed: Oct. 6, 2015

(65) Prior Publication Data

US 2016/0126082 A1    May 5, 2016

(30) Foreign Application Priority Data

Nov. 4, 2014   (JP) .................. 2014-224753

(51) Int. Cl.
| | | |
|---|---|---|
| H01J 49/00 | (2006.01) | |
| H01J 49/30 | (2006.01) | |
| H01J 49/20 | (2006.01) | |
| H01J 37/317 | (2006.01) | |
| H01J 37/147 | (2006.01) | |
| H01J 37/05 | (2006.01) | |

(52) U.S. Cl.
CPC .......... *H01J 49/30* (2013.01); *H01J 37/1472* (2013.01); *H01J 37/3171* (2013.01); *H01J 49/20* (2013.01); *H01J 37/05* (2013.01); *H01J 2237/055* (2013.01); *H01J 2237/31701* (2013.01)

(58) Field of Classification Search
CPC ........ H01J 49/30; H01J 49/20; H01J 37/1472; H01J 37/3171; H01J 37/05; H01J 2237/055; H01J 2237/31701
USPC ................................ 250/492.1, 492.2, 492.3
See application file for complete search history.

(56) References Cited

U.S. PATENT DOCUMENTS

| | | |
|---|---|---|
| 4,587,432 A | 5/1986 | Aitken |
| 5,903,009 A | 5/1999 | Bernstein et al. |
| 6,525,326 B1 | 2/2003 | Harrington et al. |

FOREIGN PATENT DOCUMENTS

JP    2536837 B2    9/1996

*Primary Examiner* — Wyatt Stoffa
*Assistant Examiner* — Hanway Chang
(74) *Attorney, Agent, or Firm* — Sughrue Mion, PLLC

(57) ABSTRACT

A mass analyzing electromagnet is provided. The mass analyzing electromagnet includes an analysis tube having an internal zone formed as a passage for the ion beam; and a shield member mounted to an inner wall surface of the analyzing tube, a portion of the shield member intersecting with a direction perpendicular to a traveling direction of an ion beam and a mass-based separation direction of the ion beam so as to block a portion of the ion beam.

15 Claims, 9 Drawing Sheets

MASS ANALYZING ELECTROMAGNET AND ION BEAM IRRADIATION APPARATUS

BACKGROUND

1. Field

The present disclosure relates to an ion beam irradiation apparatus, and a mass analyzing electromagnet comprising an analysis tube and usable in the ion beam irradiation apparatus.

2. Description of the Related Art

As an apparatus for performing substrate processing in vacuum by using an ion beam, there has been known an ion beam irradiation apparatus such as an ion implantation apparatus or an ion doping apparatus. Specifically, an apparatus disclosed in JP2536837B has been employed.

The apparatus disclosed in JP2536837B is an ion implantation apparatus in which an ion beam flight tube (also called "analysis tube") is provided in a sandwiched manner between magnetic poles of a mass analyzing electromagnet. JP2536837B points out as a problem the following phenomenon occurring within the analysis tube.

Unnecessary ion components and neutral particles separated from an ion beam through mass analysis in the mass analyzing electromagnet adhere to an inner wall surface of the analysis tube in a first region thereof intersecting with a direction of mass-based separation (mass-based separation direction) of the ion beam. Such an adhered substance to the inner wall surface will be accumulated over time to form a deposit. Then, during operation of the apparatus, unnecessary ion components and neutral particles in an ion beam can collide with the deposit, thereby causing peeling of the deposit from the inner wall surface of the analysis tube. In this case, the peeled deposit is ejected toward a target (a substrate such as a silicon wafer or a glass substrate) and mixed in the target, resulting in contamination of the target.

As a measure against this problem, JP2536837B proposes configuring the analysis tube such that the first region of the inner wall surface thereof intersecting with the mass-based separation direction in the mass analyzing electromagnet is kept from facing a beam path downstream of the analysis tube, for example, by forming the first region of the inner wall surface into a wedge shape, as illustrated in FIGS. 10 and 14 thereof.

Generally, in an ion beam transport path between an ion source and a processing chamber, the mass analyzing electromagnet occupies a relatively large installation area, as compared to other optical elements. This is because the mass analyzing electromagnet is required to cause an ion beam to be transported with a large gyration radius over a sufficient distance in order to remove unnecessary ion components therefrom.

Meanwhile, due to the space-charge effect, an ion beam diverges to a greater or lesser extent depending on its energy. The influence of spreading of an ion beam caused by the space-charge effect appears more significantly along with an increase in ion beam transport distance. In the analysis tube, the ion beam transport distance is greater than in other optical elements, and therefore the influence of spreading of an ion beam caused by the space-charge effect becomes more significant.

As means to permit divergence of an ion beam caused by the space-charge effect, it is conceivable to enlarge a spatial zone inside the analysis tube. In this case, however, what is necessary is not only to simply enlarge the spatial zone inside the analysis tube. For example, the following problems are assumed. If the spatial zone inside the analysis tube is excessively enlarged, a distance between the magnetic poles disposed outside the analysis tube is increased, and thereby a magnetic field distribution within the analysis tube becomes non-uniform. The non-uniform magnetic field distribution is likely to cause a situation where a shape of an ion beam is changed during deflection of the ion beam, causing a negative influence on mass analysis on the ion beam. Further, the inside of the analysis tube serving as the ion beam transport path needs to be maintained in a vacuum state. Thus, the excessive enlargement of the spatial zone inside the analysis tube gives rise to a need to equip a vacuum pump having a high evacuation capability in order to keep a vacuum pressure constant. The excessive enlargement of the spatial zone inside the analysis tube further causes an increase in time period after opening the ion implantation apparatus to atmospheric air once to perform maintenance of an inside of the apparatus through until an internal atmosphere of the apparatus is returned to an original vacuum pressure.

In view of the above problems, the spatial zone inside the analysis tube of the mass analyzing electromagnet is designed to have a size slightly greater than a design size of an ion beam to be subjected to passing therethrough.

Considering an overall spreading of an ion beam passing through the analysis tube, in the mass-based separation direction, spreading of the ion beam caused by separation of unnecessary ion components and neutral particles from the ion beam is significantly greater than spreading of the ion beam caused by the space-charge effect. With this in mind, in JP2536837B and many other related art techniques, a measure has been taken based on an idea of how to prevent a deposit caused by unnecessary ion components and neutral particles separated from an ion beam, i.e., a deposit occurring in the first region intersecting with the mass-based separation direction, from being ejected toward the downstream side.

However, an ion beam subjected to the influence of the space-charge effect is not spread along one direction but spread all around. Thus, spreading of an ion beam in any direction other than the mass-based separation direction along which unnecessary ion components and neutral particles are separated from the ion beam is largely influenced by divergence arising from the space-charge effect, unless the ion beam is intentionally subjected to divergence.

The size of the spatial zone inside the analysis tube is only slightly greater than that of an ion beam, as mentioned above. Thus, a peripheral end of an ion beam spread by the space-charge effect collides with the inner wall surface of the analysis tube in a second region thereof intersecting with any direction other than the mass-based separation direction, and thereby chemical components contained in the ion beam adhere to the second region of the inner wall surface. This leads to a concern that such chemical components will be accumulated over time, and the resulting deposit can be peeled from the inner wall surface due to a collision with a peripheral end of an ion beam at a certain timing, etc., and ejected toward a target, resulting in contamination of the target. For example, in the case where ion implantation is performed using different types of ions, if previously used ions are peeled from the inner wall surface of the analysis tube during ion implantation subsequently performed using different ions, and mixed in a target, the target is undesirably contaminated. From this point of view, it is also necessary to consider a measure effective in the second region intersecting with any direction other than the mass-based separation direction to fully prevent contamination of a target.

Moreover, it is difficult to exactly reproduce an ideal design shape of an ion beam by controlling respective applied voltage to electrodes constituting an extraction electrode system of an ion source. Therefore, an ion beam extracted from the extraction electrode system slightly diverges. Thus, due to an influence of such a diverged component, when an ion beam passes through the analysis tube of the mass analyzing electromagnet, a peripheral end of the ion beam undesirably collides with the inner wall surface of the analysis tube. As a result, the same problem as that in the aforementioned divergence caused by the space-charge effect occurs.

SUMMARY

In view of the above respects, the exemplary embodiments propose a technique of suppressing a situation where a deposit adhered and accumulated on an inner wall surface of an analysis tube every time an ion beam collides with a region of the inner wall surface intersecting with any direction other than the mass-based separation direction is mixed in a target.

According to an aspect of one or more exemplary embodiments, there is provided a mass analyzing electromagnet which comprises an analysis tube having an internal zone formed as a passage for an ion beam, and is configured to deflect the ion beam in a given direction to separate ions contained in the ion beam according to a difference in mass, wherein the analysis tube comprises at least one shield member provided in a region of an inner wall surface thereof intersecting with a direction perpendicular to a traveling direction of the ion beam and a mass-based separation direction of the ion beam and configured to block a peripheral end of the ion beam.

As viewed from a region of the inner wall surface of the analysis tube intersecting with the mass-based separation direction, the region of the inner wall surface of the analysis tube intersecting with the direction perpendicular to the ion beam traveling direction and the mass-based separation direction is farthest away therefrom. As regards the region of the inner wall surface of the analysis tube intersecting with the mass-based separation direction and a region adjacent thereto, it is possible to suppress ejection of the deposit toward a downstream side by using the related art techniques. On the other hand, in a region far away therefrom, it is impossible to really expect such an effect. Moreover, due to divergence of the ion beam caused by the space-charge effect and the extraction electrode system, a deposit also occurs in a heretofore-unanticipated region of the inner wall surface of the analysis tube. With a focus on these problems, the at least one shield member is provided in the region of the inner wall surface of the analysis tube intersecting with the direction perpendicular to the ion beam traveling direction and the mass-based separation direction of the ion beam, to block a peripheral end of the ion beam. This makes it possible to effectively suppress ejection of the deposit toward a target which would otherwise occur in the region of the inner wall surface of the analysis tube due to a diverged component of the ion beam caused by the space-charge effect and the extraction electrode system.

The shield member may be provided to extend from the region of the inner wall surface of the analysis tube inclinedly in a direction opposite to the traveling direction of the ion beam.

In the mass analyzing electromagnet having this feature, it becomes possible to effectively suppress the ejection of the deposit toward the target.

The shield member may be plurally provided, wherein the plurality of shield members are preferably arranged in opposed relation to each other across the ion beam.

Ideally, ion beam characteristics are vertically and bilaterally symmetrical as viewed in the ion beam traveling direction. For example, if there is a problem with a diverged component of the ion beam on an upper side of the ion beam, the same problem is highly likely to occur on a lower side of the ion beam. In view of this, the opposed arrangement of the shield members across the ion beam makes it possible to effectively suppress the ejection of the deposit toward the target.

The shield member may comprise a member body; and a catching portion extending from a distal end of the member body in a direction opposite to the traveling direction of the ion beam, in such a manner as to be bent from the distal end of the member body toward a given position in the specific region of the inner wall surface of the analysis tube at which the member body is mounted.

The catching portion provided in the above manner can serve as a catch tray for a peeled deposit. Thus, it becomes possible to more effectively suppress the ejection of the deposit toward the target.

The shield member may comprise a member body; and a sidewall portion provided along at least one of lateral ends of the member body opposed in the mass-based separation direction, wherein at least one of the member body and the sidewall portion is mounted at a given position in the specific region of the inner wall surface of the analysis tube, and the sidewall portion extends from the member body toward the given position in the specific region of the inner wall surface.

The sidewall portion provided in the above manner makes it possible to suppress escape of the deposit from the shield member in the mass-based separation direction. As regards mounting to the specific region of the inner wall surface of the analysis tube, at least one of the member body and the sidewall portion may be mounted at a given position in the specific region of the inner wall surface of the analysis tube. That is, in the case where the member body is mounted at a given position in the specific region of the inner wall surface of the analysis tube, the sidewall portion does not necessarily have to be mounted at a given position in the specific region of the inner wall surface of the analysis tube. On the other hand, in the case where the sidewall portion is mounted at a given position in the specific region of the inner wall surface of the analysis tube, the member body does not necessarily have to be mounted at a given position in the specific region of the inner wall surface of the analysis tube. Further, both of the member body and the sidewall portion may be mounted at respective given positions in the specific region of the inner wall surface of the analysis tube. When both of the member body and the sidewall portion are mounted at respective given positions in the specific region of the inner wall surface of the analysis tube, a gap formed between the shield member and the specific region of the inner wall surface of the analysis tube can be minimized. Thus makes it possible to enhance the effect of suppressing ejection of the deposit toward the downstream side.

The shield member may comprise a catching portion extending from a distal end of the member body in a direction opposite to the traveling direction of the ion beam, in such a manner as to be bent from the distal end of the member body toward the given position in the specific region of the inner wall surface of the analysis tube at which at least one of the member body and each of the side portions is mounted.

The catching portion provided in addition to the sidewall portion can serve as a catch tray for a deposit peeled from the specific region of the inner wall surface of the analysis tube, escaping from the member body of the shield member, etc. Thus, it becomes possible to further enhance the effect of suppressing ejection of the deposit toward the downstream side.

The shield member may comprise a flat plate-shaped member, and the shield member may be mounted to the region of the inner wall surface of the analysis tube in such a manner as to satisfy the following relationship: $\theta 2 < \theta 1$, where $\theta 1$ represents a mounting angle of the shield member with respect to the region of the inner wall surface of the analysis tube, and $\theta 2$ represents a divergence angle of the ion beam.

That is, the mounting angle of the shield member with respect to the region of the inner wall surface of the analysis tube may be set to be greater than the divergence angle of the ion beam. This allows a diverged component of the ion beam to come into collision with the region of the inner wall surface of the analysis tube on an upstream side of the shield member. The combination use of this technique makes it possible to more effectively suppress the ejection of the deposit toward the target.

As regards a position of the shield member in the ion beam traveling direction, the shield member may be provided at a position downstream of a middle position of the analysis tube, in the ion beam traveling direction.

The influence of the divergence caused by the space-charge effect is small in the vicinity of an inlet of the analysis tube, and thus a deposit is less likely to occur in this region. In view of this, the shield member may be disposed at a position downstream of the middle position of the analysis tube, where a deposit is more likely to occur. This makes it possible to effectively suppress the ejection of the deposit toward the downstream side.

As viewed from a region of the inner wall surface of the analysis tube intersecting with the mass-based separation direction, the region of the inner wall surface of the analysis tube intersecting with the direction perpendicular to the ion beam traveling direction and the mass-based separation direction is farthest away therefrom. As regards the region of the inner wall surface of the analysis tube intersecting with the mass-based separation direction and a region adjacent thereto, it is possible to suppress ejection of the deposit toward a downstream side by using the related art techniques. On the other hand, in a region far away therefrom, it is impossible to really expect such an effect. Moreover, due to divergence of the ion beam caused by the space-charge effect and the extraction electrode system, a deposit also occurs in a heretofore-unanticipated region of the inner wall surface of the analysis tube. With a focus on these problems, the at least one shield member is provided in the region of the inner wall surface of the analysis tube intersecting with the direction perpendicular to the ion beam traveling direction and the mass-based separation direction of the ion beam, to block a peripheral end of the ion beam. This makes it possible to effectively suppress ejection of the deposit toward a target which would otherwise occur in the region of the inner wall surface of the analysis tube due to a diverged component of the ion beam caused by the space-charge effect and the extraction electrode system.

According to another aspect of one or more exemplary embodiments, there is provided a mass analyzing electromagnet comprising an analysis tube having an internal zone formed as a passage for the ion beam; and a shield member mounted to an inner wall surface of the analyzing tube, a portion of the shield member intersecting with a direction perpendicular to a traveling direction of an ion beam and a mass-based separation direction of the ion beam so as to block a portion of the ion beam.

DESCRIPTION OF EXEMPLARY EMBODIMENTS

With reference to the drawings, the present inventive concept will now be described based on an exemplary embodiment thereof.

Figure 1:
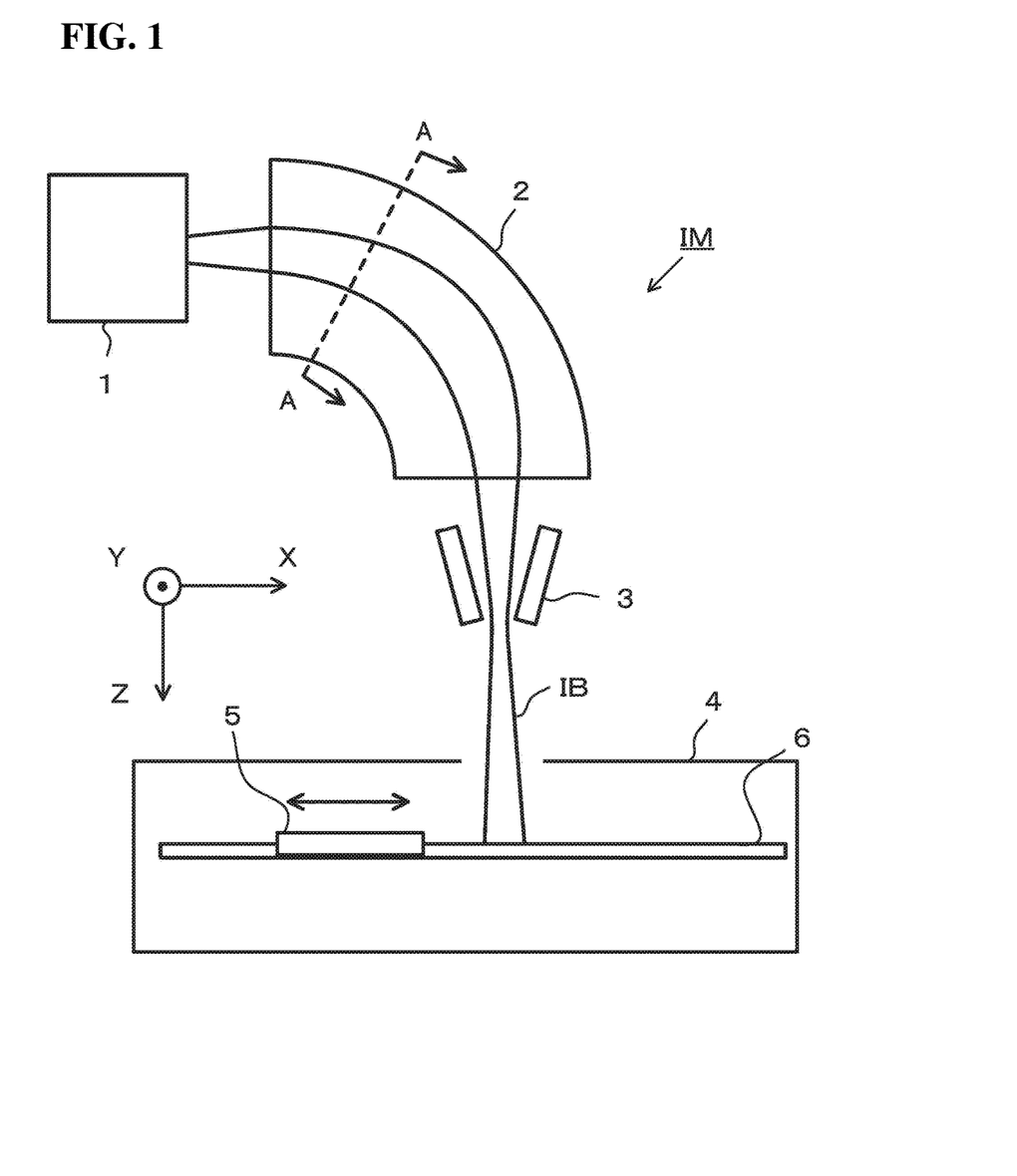
FIG. 1 is a schematic diagram illustrating a configuration of an ion beam irradiation apparatus according to an exemplary embodiment.

FIG. 1 is a schematic diagram illustrating a configuration of an ion beam irradiation apparatus IM according to an exemplary embodiment. An ion beam IB illustrated in FIG. 1 is a ribbon beam having an approximately rectangular shape in its cross-section taken along a plane perpendicular to a traveling direction of the ion beam IB (ion beam traveling direction), wherein a dimension of the ion beam IB in a direction of a long side of the approximately rectangular-shaped cross-section is greater than a dimension of an aftermentioned target 5 in the same direction. The ion beam IB in an exemplary embodiment and any other exemplary embodiment has a positive electrical charge.

The illustrated X-, Y- and Z-directions relate to the ion beam IB just after it enters a processing chamber 4. Specifically, the X-direction is a direction of a short side of the cross-section of the ion beam IB, and the Y-direction is a direction of the long side of the cross-section of the ion beam IB. The Z-direction is the ion beam traveling direction. These directions are appropriately changed depending on a position on a transport path of the ion beam IB (ion beam transport path). The same applies to any other figure.

An ion beam IB emitted from an ion source 1 is separated into a desired ion component and unnecessary ion components by a mass analyzing electromagnet 2, and the resulting ion beam IB containing the desired ion component passes through an analysis slit 3. The ion beam IB passing through the analysis slit 3 enters the processing chamber 4. In the processing chamber 4, a target 5, i.e., a substrate such as a silicon wafer or a glass substrate, is reciprocatingly conveyed in the arrowed directions in such a manner as to be moved across the ion beam IB along a linear guide 6. In this way, the target 5 is subjected to ion beam irradiation processing.

Figure 2:
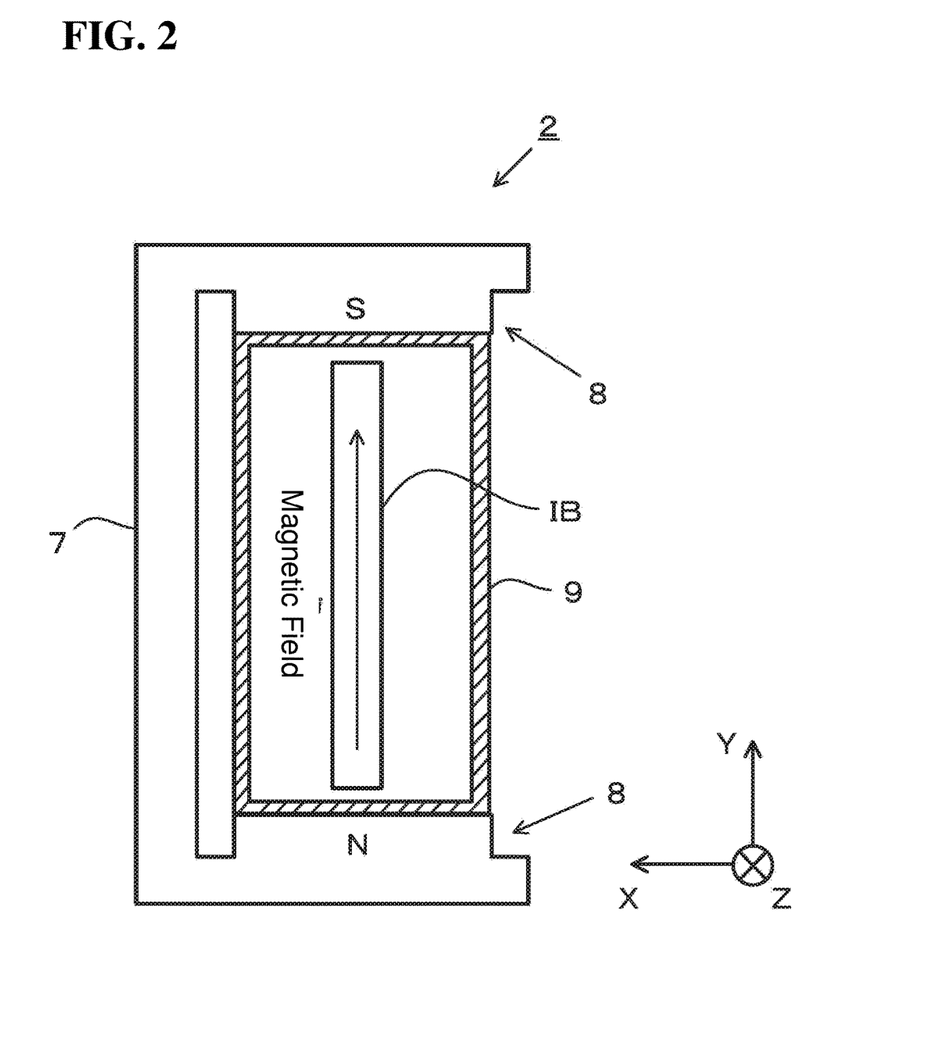
FIG. 2 is a sectional view taken along the line A-A in FIG. 1.

FIG. 2 is a sectional view taken along the line A-A in FIG. 1. A C-shaped yoke 7 constituting the mass analyzing electromagnet 2 comprises a pair of magnetic poles 8 sandwiching the ion beam IB in the Y-direction. Each of the magnetic poles 8 is wound by a non-illustrated coil. When a current is applied to the coils, a magnetic field is generated to cut across the ion beam IB upwardly in FIG. 2, and thereby the ion beam IB is deflected in a direction opposite to the illustrated X-direction. Based on such a deflection action of the magnetic field, unnecessary ion components and neutral particles are removed from the ion beam IB. In this specification, a direction along which unnecessary ion components and neutral particles are removed from the ion beam IB by means of deflection of the ion beam IB is referred to as "mass-based separation direction". Specifically, in the exemplary embodiment illustrated in FIG. 2, a direction parallel to the X-direction is defined as the mass-based separation direction. Although the X-direction and the mass-based separation direction in FIG. 2 are in parallel relation, it should be noted that the two directions in the mass analyzing electromagnet do not necessarily have to be parallel to each other.

An analysis tube 9 is disposed between the pair of magnetic poles 8, as with JP2536837B, and configured to allow the ion beam IB to pass therethrough. With reference to FIGS. 3 to 9, a configuration of the analysis tube 9 will be described in detail. Although FIG. 2 depicts the dipole magnet comprising the C-shaped yoke 7, it should be understood that an H-shaped yoke may be alternatively used, and a means to deflect the ion beam IB, usable in the mass analyzing electromagnet, is not limited to a specific configuration.

Figure 3:
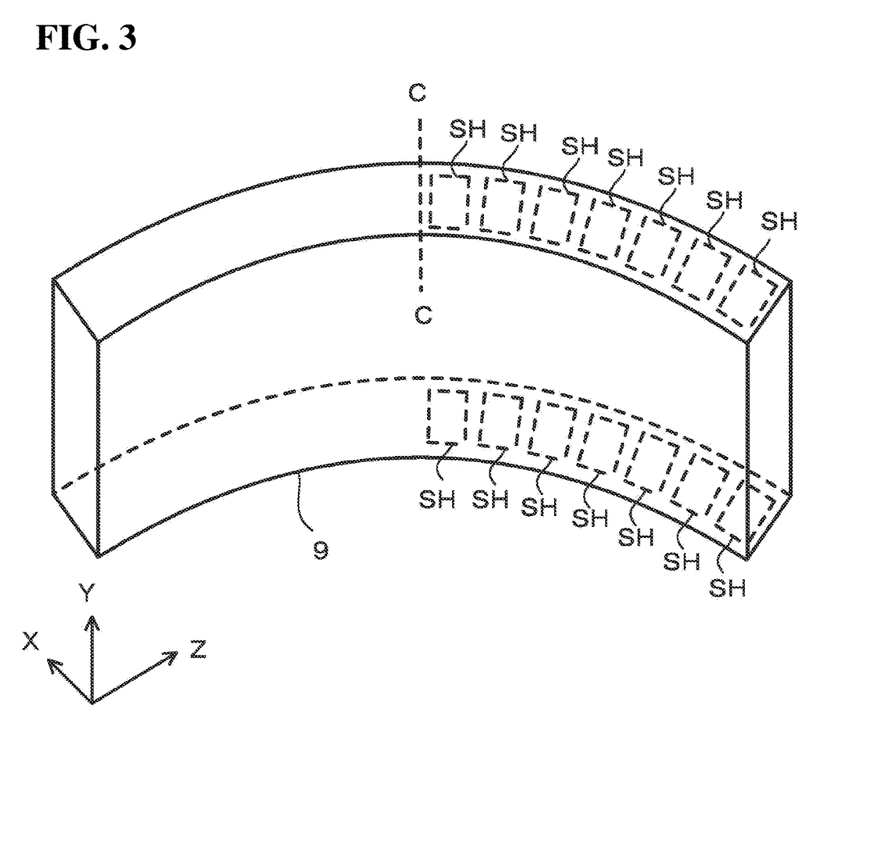
FIG. 3 is a schematic diagram illustrating one configuration of an analysis tube in a mass analyzing electromagnet according to an exemplary embodiment.

FIG. 3 is a schematic diagram illustrating one configuration of an analysis tube in a mass analyzing electromagnet according to an exemplary embodiment. The analysis tube 9 is curved along the ion beam transport path, and internally formed with a spatial zone for allowing the ion beam IB to pass therethrough. It should be noted that the X-, Y- and Z-directions illustrated in FIG. 3 relate to the ion beam IB just after it enters the analysis tube 9, and these directions are appropriately changed depending on a position of the ion beam IB being passing through the analysis tube 9.

A shield member SH is mounted to an inner wall surface of the analysis tube 9 defining the spatial zone for allowing the ion beam IB to pass therethrough, in a specific region thereof intersecting with a direction (direction parallel to the Y-direction) perpendicular to the ion beam traveling direction (Z-direction) and the mass-based separation direction (direction parallel to the X-direction), to block a peripheral end of the ion beam IB. The shield member SH provided in the above manner makes it possible to suppress a situation where a deposit occurring in the specific region of the inner wall surface of the analysis tube due to a diverged component of the ion beam IB caused by the space-charge effect and an extraction electrode system of the ion source 1 is ejected toward the target.

In the exemplary embodiment illustrated in FIG. 3, the shield member SH is provided plurally, wherein the plurality of shield members SH are arranged in vertically opposed relation to each other across the ion beam transport path.

Ideally, ion beam characteristics are vertically and bilaterally symmetrical as viewed in the ion beam traveling direction. For example, if there is a problem with a diverged component of the ion beam IB, on an upper side of the ion beam IB, the same problem is highly likely to occur on a lower side of the ion beam IB. In view of this, the opposed arrangement of the shield members SH across the ion beam IB makes it possible to effectively suppress ejection of the deposit toward the target. However, the arrangement of the shield members SH is not limited to such a specific arrangement. For example, the plurality of shield members SH may be arranged across the ion beam IB and vertically alternately along the ion beam traveling direction.

Although FIG. 3 depicts the plurality of shield members SH, it should be noted that the number of the shield members SH may be one. It is to be understood that, even in the case where only one shield member SH is provided, it is possible to bring out an effect of suppressing ejection of a deposit toward a target being occurred in a heretofore-unanticipated region of the inner wall surface of the analysis tube due to a diverged component of the ion beam IB caused by the space-charge effect and the extraction electrode system.

Further, in the case where the shield member SH is plurally arranged, the shield members SH are not necessarily arranged on opposed sides across the ion beam IB, but may be arranged on only one side.

As a material for the shield member SH, it is conceivable to use carbon which is highly resistant to sputtering by the ion beam IB and is easily commercially available. As a material other than carbon, it is conceivable to use the same material as that for the target. For example, when the target is a silicon wafer, silicon may be used, although it is relatively high in cost. In this case, even in a situation where the shield member SH is sputtered by the ion beam IB and resulting particles of the shield member SH is mixed in the target, a possibility of contamination of the target is reduced. Further, in place of the member made of silicon, it is possible to use a metal member having a surface coated with silicon.

An installation position of the shield member SH within the analysis tube 9 may be set at any position on the ion beam transport path. However, it is desirable to dispose the shield member SH at a position downstream (in terms of the ion beam traveling direction) of a middle position (line C-C in FIG. 3) of the analysis tube 9 in the ion beam traveling direction.

The influence of the divergence caused by the space-charge effect is small in the vicinity of an inlet of the analysis tube 9, and thus a deposit is less likely to occur in this region. In view of this, the shield member SH is disposed at a position downstream of the middle position of the analysis tube 9, where a deposit is more likely to occur. This makes it possible to effectively suppress the ejection of the deposit toward a downstream side.

Figure 4A:
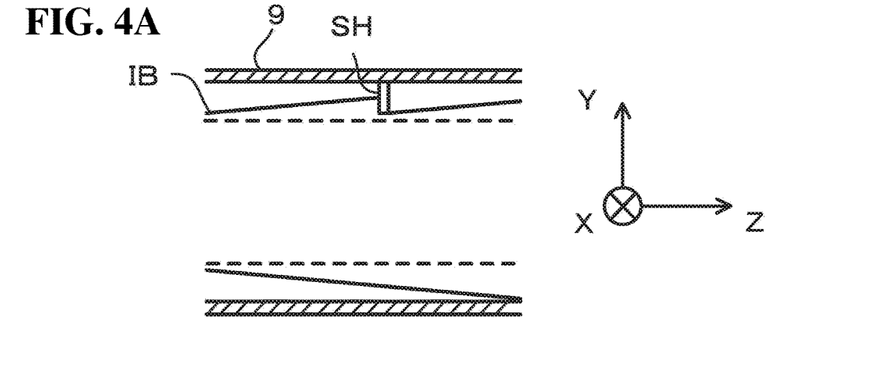
FIGS. 4A to 4C are schematic diagrams illustrating a first example of a shield member in the mass analyzing electromagnet according to an exemplary embodiment.
Figure 4B:
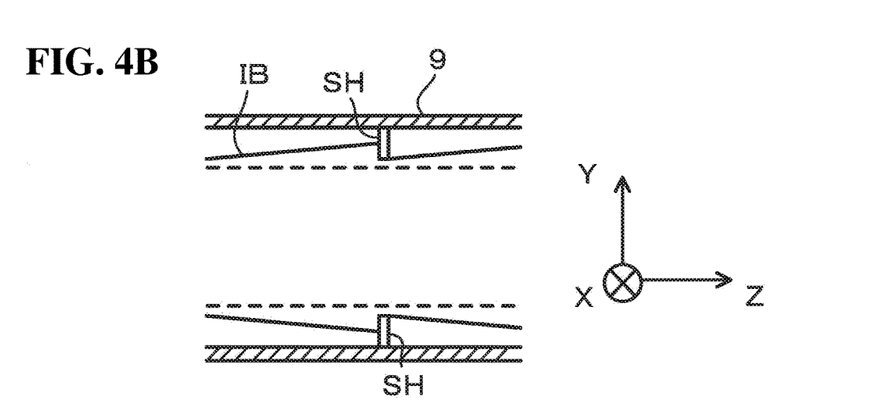
Figure 4C:
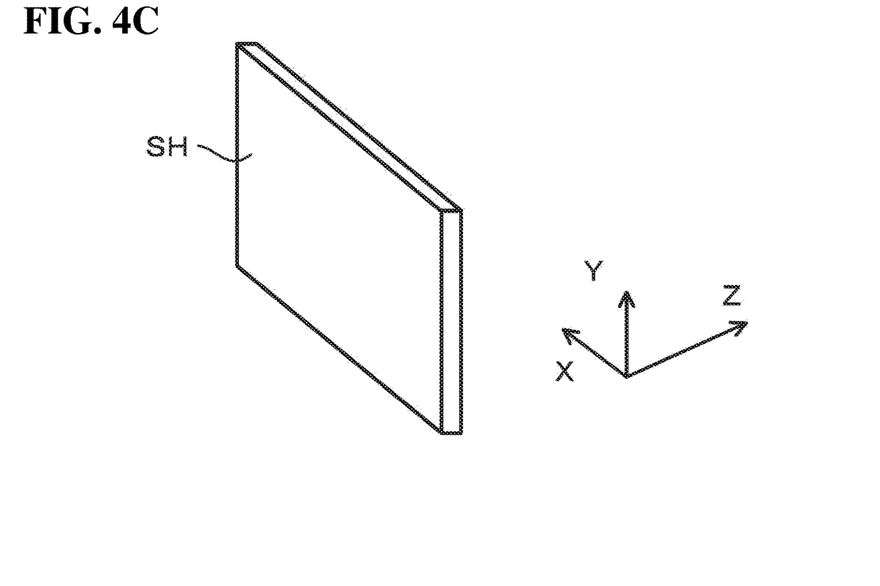

FIGS. 4A to 4C are schematic diagrams illustrating a first example of the shield member SH in the mass analyzing electromagnet according to an exemplary embodiment. For example, as depicted in FIG. 4C, a shield member SH in the first example is a flat plate-shaped member. The flat plate-shaped shield member SH is mounted perpendicularly to the specific region of the inner wall surface of the analysis tube 9, as depicted in FIGS. 4A and 4B.

Figure 5A:
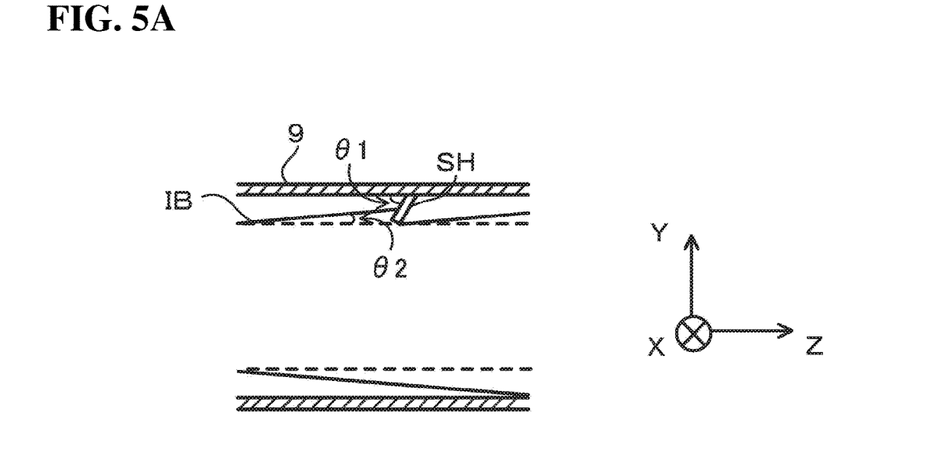
FIGS. 5A and 5B are schematic diagrams illustrating a second example of the shield member in the mass analyzing electromagnet according to an exemplary embodiment.
Figure 5B:
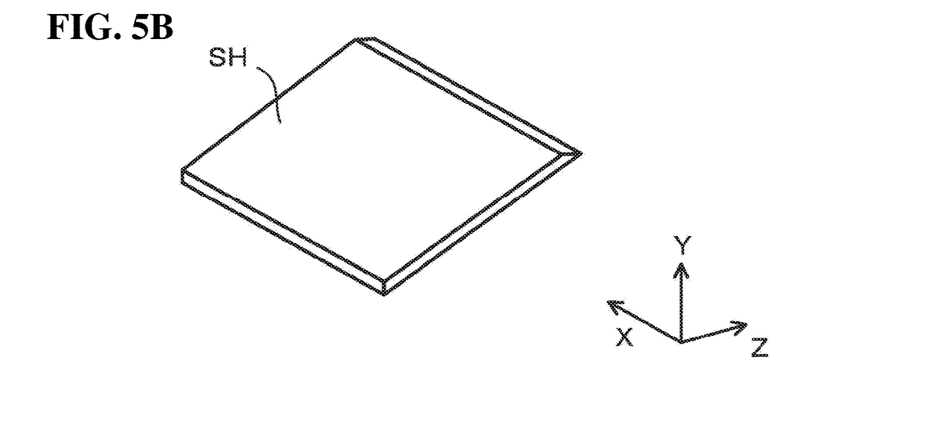

FIGS. 5A and 5B are schematic diagrams illustrating a second example of the shield member SH in the mass analyzing electromagnet according to an exemplary embodiment. In the first example illustrated in FIGS. 4A to 4C, the shield member SH is mounted perpendicularly to the specific region of the inner wall surface of the analysis tube 9, so that peeled deposit is likely to be scattered from the specific region of the inner wall surface of the analysis tube 9 and/or the shield member SH toward the ion beam IB, i.e., the effect of suppressing the ejection of the deposit toward the downstream side is insufficient. The second example illustrated in FIGS. 5A and 5B is improved in this regard.

A shield member SH depicted in FIG. 5B is a flat plate-shaped member, as with the first example in FIGS. 4A to 4C, and mounted to the specific region of the inner wall surface of the analysis tube 9 in such a manner as to extend from the specific region of the inner wall surface of the analysis tube 9 inclinedly in a direction opposite to the ion beam traveling direction (inclinedly toward an upstream side of the ion beam transport path). This configuration makes it possible to reduce scattering of a deposit peeled from the specific region of the inner wall surface of the analysis tube 9 and/or the shield member SH, toward the ion beam IB, to enhance the effect of suppressing the ejection of the deposit toward the downstream side, as compared to the first example illustrated in FIGS. 4A to 4C.

As regards a mounting angle of the shield member SH, it is desirable to set it in the following manner. As depicted in FIG. 5A, the shield member SH is mounted to the specific region of the inner wall surface of the analysis tube 9 in such a manner as to satisfy the following relationship: $\theta 2 < \theta 1$, where $\theta 1$ represents a mounting angle of the shield member SH with respect to the specific region of the inner wall surface of the analysis tube 9, and $\theta 2$ represents a divergence angle of the ion beam IB.

When the shield member SH is mounted to the specific region of the inner wall surface of the analysis tube 9 at the above angle, it becomes possible to allow a diverged component of the ion beam IB to become incident on a position between the shield member SH and the specific region of the inner wall surface of the analysis tube 9. As illustrated in FIG. 3, the specific region of the inner wall surface of the analysis tube 9 consists of two sub-regions vertically opposed across the ion beam IB. In the second example illustrated in FIGS. 5A and 5B, no shield member is provided on the other side across the ion beam IB in the inner wall surface. Alternatively, the shield member SH may also be mounted to the other side of the inner wall surface. This also applies to any other example described below.

FIGS. 6A to 6F are schematic diagrams illustrating a third example of the shield member SH in the mass analyzing electromagnet according to an exemplary embodiment. As a measure against scattering of the deposit toward the ion beam IB, it is possible to use a configuration depicted in FIGS. 6A to 6F. A shield member SH illustrated in FIGS. 6A to 6F comprises a member body B, and a catching portion R extending from a distal end of the member body B in a direction opposite to the ion beam traveling direction (toward the upstream side of the ion beam transport path). The catching portion R is bent from the distal end of the member body B toward a given position in the specific region of the inner wall surface of the analysis tube 9 at which the member body B is mounted. The catching portion R provided in the above manner can serve as a catch tray for a peeled deposit. Thus, it becomes possible to further suppress the ejection of the deposit toward the target. The catching portion R and the member body B may be formed as a single common member, wherein the catching portion R may be formed by bending a part of the member body B. Alternatively, the catching portion R and the member body B may be formed as separate members, and fastened together by a bolt.

Figure 6A:
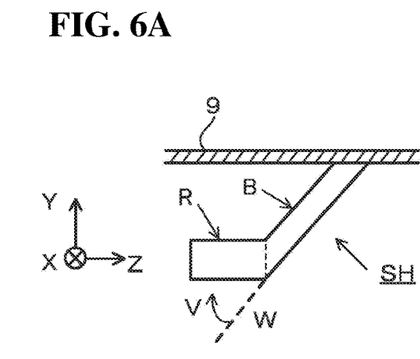
FIGS. 6A to 6F are schematic diagrams illustrating a third example of the shield member in the mass analyzing electromagnet according to an exemplary embodiment.
Figure 6B:
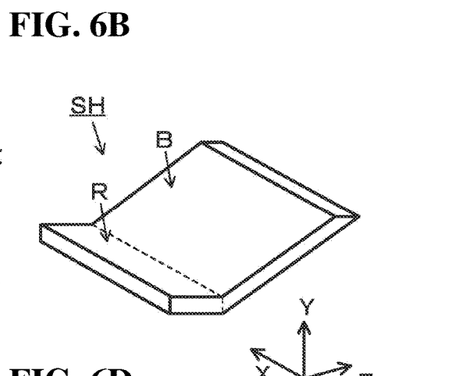
Figure 6C:
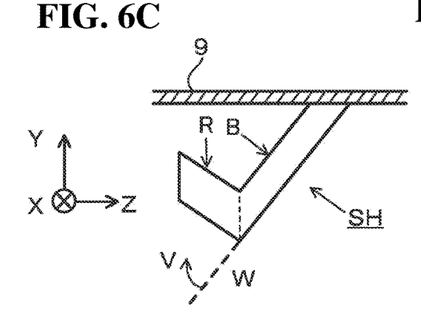
Figure 6D:
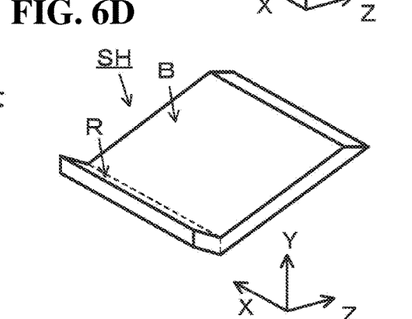

A fastening angle or a bending angle between the member body B and the catching portion R may be set to any value. For example, the catching portion R may be provided to become approximately parallel to the ion beam traveling direction, as illustrated in FIGS. 6A and 6B. Alternatively, from a viewpoint of suppressing the ejection of the deposit toward the downstream side, the shield member may be configured such that the catching portion R is more largely bent toward the given position in the specific region of the inner wall surface of the analysis tube 9, as illustrated in FIGS. 6C and 6D. The member body B is not limited to the flat plate-shaped member, but may be a curved-shaped member, as illustrated in FIGS. 6E and 6F.

Figure 6E:
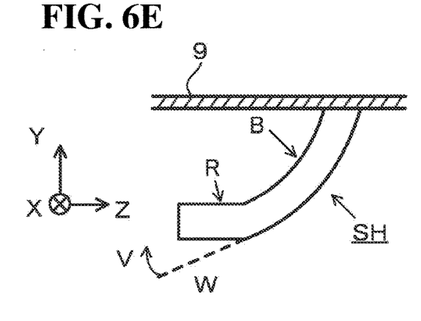
Figure 6F:
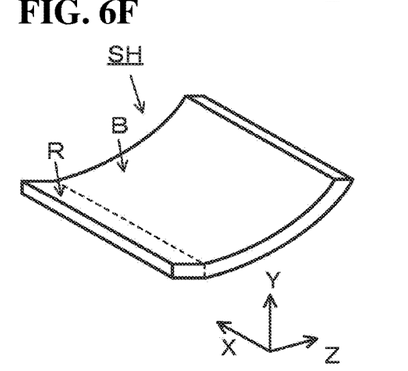

The shield member SH to be mounted to the other side of the inner wall surface of the analysis tube 9 which intersects with a direction opposite to the Y-direction may have a configuration obtained by vertically reversing each of the shield members SH illustrated in FIGS. 6A to 6F, or may have the configuration in any example other than the third example. This also applied to any other example described below. As used herein, the state in which "the catching portion R is bent from the distal end of the member body B toward the given position in the specific region of the inner wall surface of the analysis tube 9 at which the member body B is mounted" means that the catching portion R is bent from the broken line W depicted as an extension line from the member body B, toward the given position in the specific region of the inner wall surface of the analysis tube 9, in a direction indicated by the arrowed line V, as illustrated in FIGS. 6A, 6C and 6E.

FIGS. 7A to 7D are schematic diagrams illustrating a fourth example of the shield member SH in the mass analyzing electromagnet according to an exemplary embodiment. In the second and third examples depicted in FIGS. 5A and 5B and FIGS. 6A to 6F, respectively, there is a possibility that the deposit escapes from the shield member SH toward the downstream side in the mass-based separation direction. The fourth example illustrated in FIGS. 7A to 7D is improved in this regard.

A shield member SH of the fourth example illustrated in FIGS. 7A to 7D comprises a member body B, and a pair of sidewall portions S provided along respective lateral ends of the member body B opposed in the mass-based separation direction. In this example, the shield member SH is mounted at a given position in the specific region of the inner wall surface of the analysis tube 9, through at least one of the member body B and the sidewall portions S, although details of how to mount the sidewall portions S and the member body B to the specific region of the inner wall surface of the analysis tube 9 will be described later with reference to FIGS. 8A to 8D.

Figure 7A:
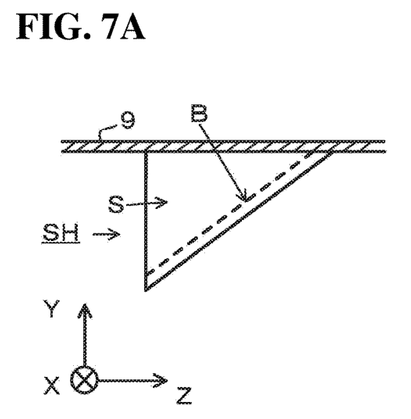
FIGS. 7A to 7D are schematic diagrams illustrating a fourth example of the shield member in the mass analyzing electromagnet according to an exemplary embodiment.
Figure 7B:
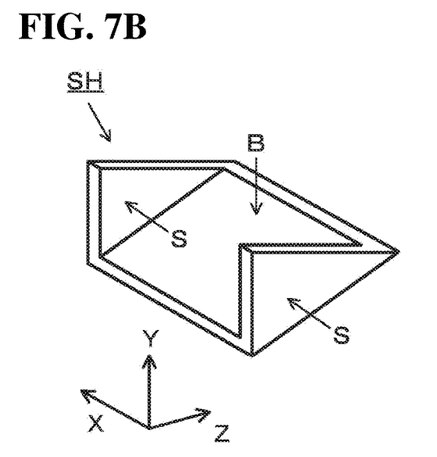
Figure 7C:
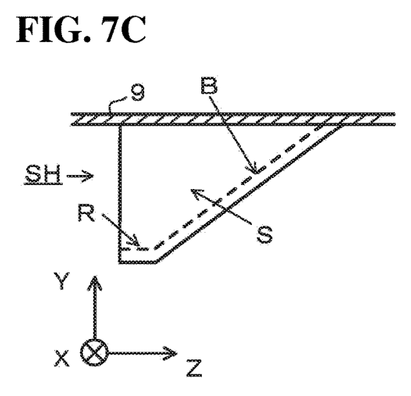
Figure 7D:
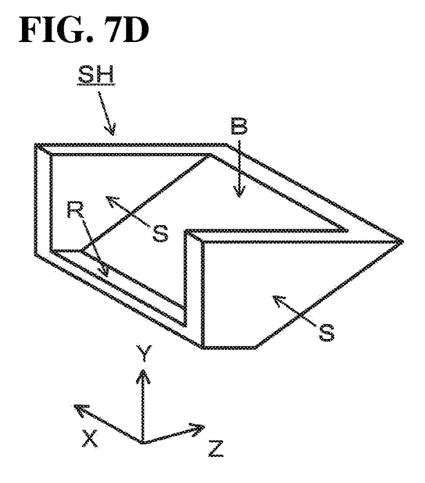

As illustrated in FIGS. 7A and 7B, each of the sidewall portions S extends from the member body B toward the given position in the specific region of the inner wall surface of the analysis tube 9. The sidewall portions S provided in the above manner make it possible to suppress escape of the deposit from the shield member SH in the mass-based separation direction.

Although it is desirable to provide the sidewall portion S along each of the lateral ends of the member body B opposed in the mass-based separation direction, as in the fourth example, the sidewall portion S may be provided along only one of the lateral ends of the member body B. Even this configuration can exert an effect of suppressing escape of the deposit in the mass-based separation direction. It is to be understood that the sidewall portion S and the member body B may be formed as a single common member or may be formed as separate members.

The shield member illustrated in FIGS. 7A and 7B may be used in combination with the third example in FIGS. 6A to 6F. For example, a shield member SH illustrated in FIGS. 7C and 7D comprises a member body B, a pair of sidewall portions S, and a catching portion R. This configuration makes it possible to further enhance the effect of suppressing the ejection of the deposit toward the downstream side.

Figure 8A:
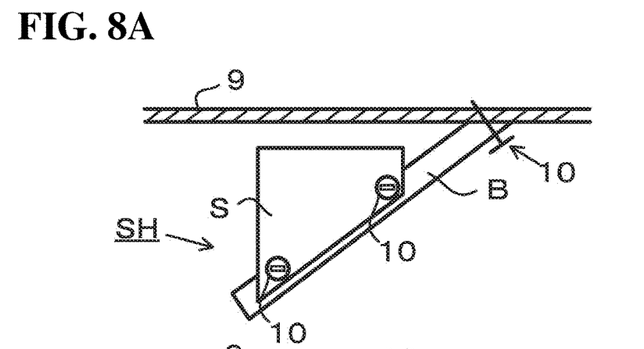
FIGS. 8A to 8D are schematic diagrams illustrating mounting of the shield member to an inner wall surface of the analysis tube, in the mass analyzing electromagnet according to an exemplary embodiment.
Figure 8B:
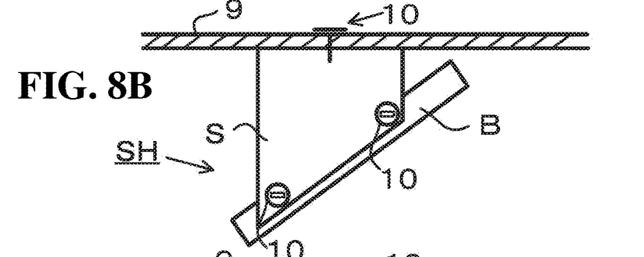
Figure 8C:
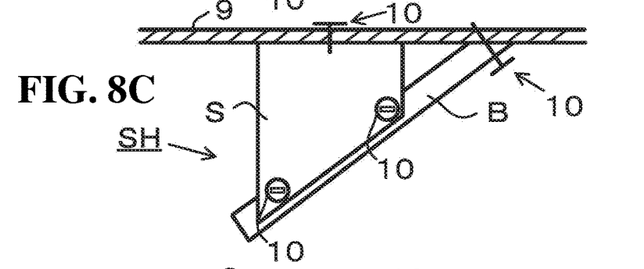

FIGS. 8A to 8D are schematic diagrams illustrating mounting of the shield member SH to the inner wall surface of the analysis tube in the mass analyzing electromagnet according to an exemplary embodiment. As illustrated in FIG. 8A, the member body B may be mounted at a given position in the specific region of the inner wall surface of the analysis tube 9 by a bolt 10, and then the sidewall portion S may be mounted to the member body B by a bolt 10. Alternatively, as illustrated in FIG. 8B, the sidewall portion S may be mounted at a given position in the specific region of the inner wall surface of the analysis tube 9 by a bolt 10, and then the member body B may be mounted to the sidewall portion S by a bolt 10. Alternatively, as illustrated in FIG. 8C, both of the member body B and the sidewall portion S may be mounted at a given position in the specific region of the inner wall surface of the analysis tube 9 by respective bolts 10.

When both of the member body B and the sidewall portion S are mounted at respective given positions in the specific region of the inner wall surface of the analysis tube 9, a gap formed between the shield member SH and the specific region of the inner wall surface of the analysis tube 9 can be minimized. For example, in comparison between FIGS. 8A to 8C, the configuration in FIG. 8C can minimize the gap formed between the shield member SH and the specific region of the inner wall surface of the analysis tube 9.

Figure 8D:
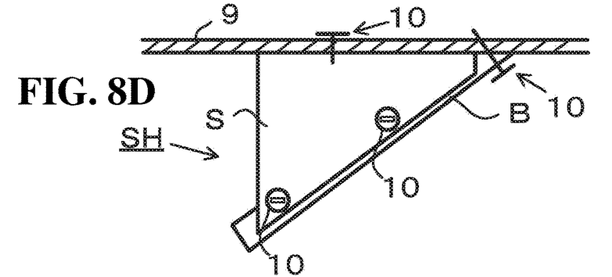

The gap can be almost eliminated by extending the sidewall portion S in the configuration illustrated in FIG. 8C, along the lateral end of the member body B, as in a configuration illustrated in FIG. 8D. As the gap formed between the shield member SH and the specific region of the inner wall surface of the analysis tube 9 becomes smaller, a possibility that the deposit escapes toward the downstream side through the gap becomes lower, so that it becomes possible to further enhance the effect of suppressing the deposit toward the downstream side.

Figure 9A:
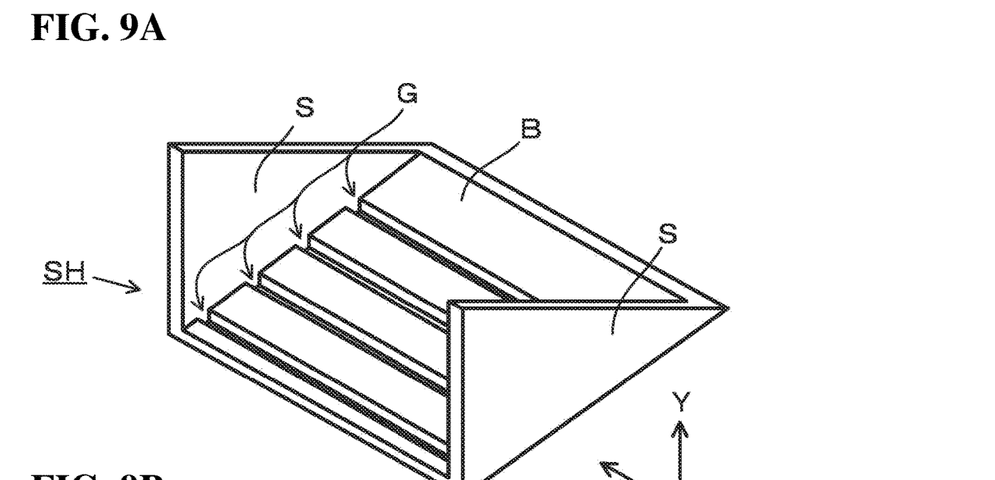
FIGS. 9A and 9B are schematic diagrams illustrating a fifth example of the shield member in the mass analyzing electromagnet according to an exemplary embodiment.
Figure 9B:
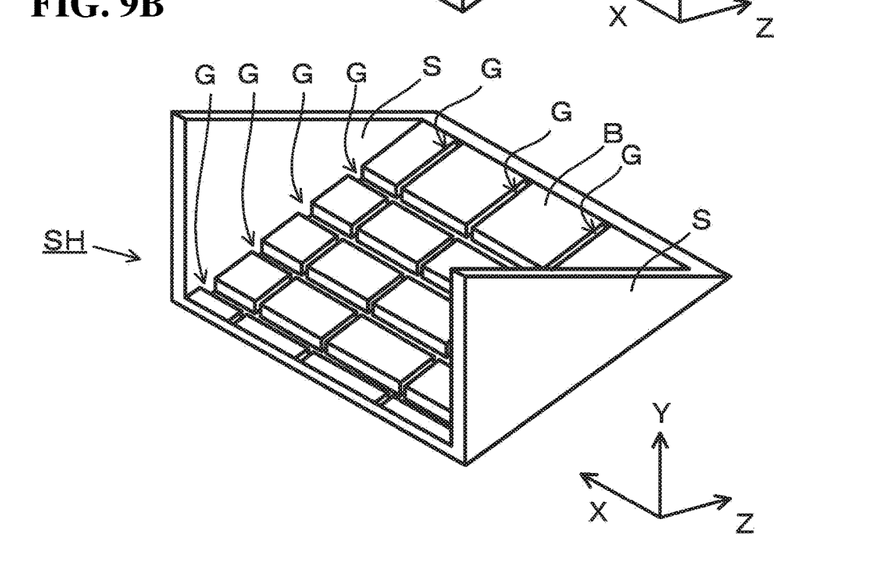

FIGS. 9A and 9B are schematic diagrams illustrating a fifth example of the shield member SH in the mass analyzing electromagnet according to an exemplary embodiment. A shield member SH illustrated in FIG. 9A comprises a member body B having a plurality of grooves G formed in a surface thereof facing in the direction opposite to the ion beam traveling direction (toward the upstream side of the ion beam transport path). In the shield member SH configured in this manner, a deposit peeled from the specific region of the inner wall surface of the analysis tube 9 is trapped by the grooves G, and thereby ejection of the deposit toward the downstream side can be suppressed. The grooves G may be formed to extend along one direction, as illustrated in FIG. 9A, or may be formed to extend along a plurality of different directions, as illustrated in FIG. 9B. Such grooves G may also be formed in any portion of the shield member SH other than the member body B, such as the catching portion R or the sidewall portion S. Further, in the case where, due to a material for the shield member SH, there is difficulty in forming the grooves G, the surface may be roughened by blasting.

Other Modifications

The ion beam IB for use in the exemplary embodiments is not limited to the ribbon beam having an approximately rectangular-shaped cross-section, but may be a spot-shaped ion beam which is to be reciprocatingly scanned in a longitudinal direction of rectangular-shaped cross-section of the ribbon beam. In the above exemplary embodiments, the analysis tube 9 is a rectangular tube. Alternatively, the analysis tube may be a circular tube.

In the above exemplary embodiments, a combination of the related art configuration disclosed in JP2536837B and an exemplary embodiment of the present application has not been discussed. However, it is to be understood that such a combination is not inhibited.

In the above exemplary embodiments, the ion beam IB is described as a type having a positive electrical charge. Alternatively, the ion beam IB may be a type having a negative electrical charge.

In addition to the above exemplary embodiments, it is obvious to those skilled in the art that various other changes and modifications may be made in the above exemplary embodiments without departing from the spirit and scope of the present invention as set forth in appended claims.

What is claimed is:

1. A mass analyzing electromagnet comprising:
   an analysis tube comprising:
      two side walls,
      a top wall, and
      a bottom wall,
   wherein at least one of the top wall and the bottom wall comprises at least one shield member,
   wherein the at least one shield member is configured to extend into the analysis tube to block a peripheral end of an ion beam, and
   wherein the analysis tube has an internal zone formed as a passage for the ion beam, the mass analyzing electromagnet being configured to deflect the ion beam toward the side walls to separate ions contained in the ion beam according to a difference in mass.

2. The mass analyzing electromagnet as recited in claim 1, wherein the at least one shield member extends into the analysis tube inclinedly in a direction opposite to a traveling direction of the ion beam.

3. The mass analyzing electromagnet as recited in claim 1, wherein the at least one shield member comprises a plurality of shield members, and wherein the plurality of shield members are arranged in opposed relation to each other across the ion beam.

4. The mass analyzing electromagnet as recited in claim 1, wherein each of the at least one shield member comprises:
   a member body; and
   a catching portion extending from a distal end of the member body in a direction opposite to a traveling direction of the ion beam, in such a manner as to be bent from the distal end of the member body toward a given position on the least one of the top wall and the bottom wall of the analysis tube at which the member body is mounted.

5. The mass analyzing electromagnet as recited in claim 1, wherein each of the at least one shield member comprises:
   a member body; and a sidewall portion provided along at least one of lateral ends of the member body opposed in a deflection direction, wherein at least one of the member body and the sidewall portion is mounted at a position on the least one of the top wall and the bottom wall of the analysis tube, and the sidewall portion extends from the member body toward the position.

6. The mass analyzing electromagnet as recited in claim 5, wherein each of the at least one shield member comprises:

a catching portion extending from a distal end of the member body in a direction opposite to a traveling direction of the ion beam, in such a manner as to be bent from the distal end of the member body toward the position on the least one of the top wall and the bottom wall of the analysis tube at which at least one of the member body and each of the side portions is mounted.

7. The mass analyzing electromagnet as recited in claim 1, wherein the shield member comprises a flat plate-shaped member.

8. The mass analyzing electromagnet as recited in claim 7, wherein the shield member is mounted on the least one of the top wall and the bottom wall to of the analysis tube in such a manner as to satisfy the following relationship: $\theta 2 < \theta 1$, where $\theta 1$ represents a mounting angle of the shield member with respect a given position on the least one of the top wall and the bottom wall of the analysis tube at which the shield member is mounted, and $\theta 2$ represents a divergence angle of the ion beam.

9. The mass analyzing electromagnet as recited in claim 1, wherein the shield member is provided at a position downstream of a middle position of the analysis tube, as viewed in a traveling direction of the ion beam.

10. The mass analyzing electromagnet as recited in claim 1, wherein the ion beam is a ribbon beam having an approximately rectangular shape in a cross-section taken along a plane perpendicular to a traveling direction of the ion beam, and wherein the shield member is configured to block an end of the ribbon beam in a direction of a long side of the approximately rectangular-shaped cross-section.

11. An ion beam irradiation apparatus comprising:
a mass analyzing electromagnet comprising:
an analysis tube comprising:
two side walls,
a top wall, an d
a bottom wall, wherein at least one of the top wall and the bottom wall is configured to include at least one shield member, wherein the at least one shield member is configured to extend into the analysis tube to block a portion of a peripheral end of an ion beam, wherein the analysis tube has an internal zone formed as a passage for the ion beam, and is configured to deflect the ion beam toward the side walls to separate ions contained in the ion beam according to a difference in mass.

12. A mass analyzing electromagnet comprising:
an analysis tube having an internal zone formed as a passage for an ion beam; and
a shield member mounted to a top wall or a bottom wall of the analyzing tube and extending into the analyzing tube so as to block a peripheral end of the ion beam.

13. The mass analyzing electromagnet as recited in claim 12, wherein the shield member comprises a plurality of shield members mounted at different positions on the top wall and the bottom wall of the analyzing tube.

14. The mass analyzing electromagnet as recited in claim 12, wherein the shield member is inclined with respect to the top wall or the bottom wall of the analyzing tube to which the shield member is mounted.

15. The mass analyzing electromagnet as recited in claim 14, wherein the shield member is inclined in a direction opposite to a traveling direction of the ion beam.

* * * * *